United States Patent [19]

Erpelding et al.

[11] Patent Number: 5,699,212
[45] Date of Patent: Dec. 16, 1997

[54] METHOD OF ELECTROSTATIC DISCHARGE PROTECTION OF MAGNETIC HEADS IN A MAGNETIC STORAGE SYSTEM

[75] Inventors: A. David Erpelding; Surya Pattanaik; Randall George Simmons, all of San Jose, Calif.

[73] Assignee: International Business Machines Corporation, Armonk, N.Y.

[21] Appl. No.: 646,753

[22] Filed: May 1, 1996

[51] Int. Cl.⁶ .................. G11B 5/60; G11B 5/40
[52] U.S. Cl. .............. 360/104; 360/97.02; 360/113; 360/108
[58] Field of Search ................ 360/97.01–97.04, 360/103, 104, 113, 126, 128, 108

[56] References Cited

U.S. PATENT DOCUMENTS

| | | | |
|---|---|---|---|
| 4,800,454 | 1/1989 | Schwarz et al. | 360/103 |
| 4,835,345 | 5/1989 | Haarde | 174/68.5 |
| 4,877,175 | 10/1989 | Jones et al. | 228/102 |
| 5,142,425 | 8/1992 | Gailbreath, Jr. et al. | 360/97.02 |
| 5,253,134 | 10/1993 | Kato et al. | 360/126 |
| 5,272,582 | 12/1993 | Shibata et al. | 360/126 |
| 5,303,096 | 4/1994 | Keller | 360/97.03 |
| 5,465,186 | 11/1995 | Bajorek et al. | 360/113 |
| 5,491,605 | 2/1996 | Hughbanks et al. | 360/128 |
| 5,530,604 | 6/1996 | Pattanaik | 360/104 |
| 5,539,598 | 7/1996 | Denison et al. | 360/113 |
| 5,559,051 | 9/1996 | Voldman et al. | 437/51 |
| 5,566,038 | 10/1996 | Keel et al. | 360/128 |

OTHER PUBLICATIONS

IBM TDB vol. 36, No. 12 Dec. 1993 Elector Static Discharge Protection for Magneto Resistive Head/Arm Assembly by H. Greaves et al.

IBM TDB vol. 38, No. 01 Jan. 1995 Manufacturable Magnetoresistive Slider Electrical Overstress Protector by W. Brooks.

Primary Examiner—Jefferson Evans
Attorney, Agent, or Firm—Noreen A. Krall

[57] ABSTRACT

MR heads having MR sensors are protected against damage caused by electrostatic discharge or the presence of electrostatically charged fields. A shunt is provided across the adjacent conductive leads or traces to the MR sensor at a point that is immediately adjacent their termination on the MR head. A solder bridge may be used for the shunt. The solder shunt is removed prior to putting the integrated suspension on which the MR head is mounted into operation in a magnetic disk drive system. The solder shunt is removed by reflowing the solder and drawing the reflowed solder away from the leads to break electrical connection of the shunt across the adjacent leads to the MR sensor. To facilitate removing the shunt by reflowing the solder, at least one solder lobe of a chosen geometry is placed adjacent a lead. This lobe includes a confining lobe which serves to confine the solder in the shunt region when the shunt is formed, and a designated portion which serves to draw the solder to a designated location away from the shunt region upon subsequent solder reflow, thereby causing a physical break in the shunt. Physical removal of the solder material would not be required. The shunt may also be in the form of an integral bridge of conductive material interconnecting the adjacent leads, which is removed by using a laser to melt the material.

27 Claims, 8 Drawing Sheets

METHOD OF ELECTROSTATIC DISCHARGE PROTECTION OF MAGNETIC HEADS IN A MAGNETIC STORAGE SYSTEM

BACKGROUND OF THE INVENTION

1. Field of the Invention

The present invention relates generally to protection against damage to magnetic head assemblies caused by electrostatic discharge during handling and assembly thereof in magnetic storage systems, and more particularly to a method of protecting against electrostatic discharge induced damages in respect to magnetic head assemblies implementing magneto-resistive ("MR") sensors in magnetic disk drive systems.

2. Description of the Related Art

MR sensors are well known and are particularly useful as read elements in magnetic transducers, especially at high recording densities. They are used as read elements in thin film heads ("MR heads") for sensing recorded signals on magnetic disks in magnetic disk drive systems used in the computer industry. The MR sensor includes a thin stripe of magnetoresistive material which is positioned between a pair of thin film gap layers which are in turn sandwiched between a pair of thin film shield layers. The MR sensor is part of a recording head which is attached to the tip of a flexible member which is cantilevered from an actuator arm for positioning the head relative to the magnetic disk surface to perform read and write operations. This assemblage is often referred to in the industry as a head-suspension, head-gimbal or head-arm assembly.

A major problem that is encountered during manufacture, handling and use of MR heads is the buildup of electrostatic charges on the various elements of a head or other objects which come into contact with the head, and the accompanying spurious discharge of the static electricity thus generated. Static charges may be produced by the presence of certain materials, such as plastics, during construction and subsequent handling of the heads, for example. Further, in the presence of electrostatically charged fields, the MR stripe is prone to damage.

This sensitivity to electrostatic damage is particularly severe for MR sensors because of their relatively small physical size. For example, an MR sensor used for extremely high recording densities will have a cross-section of 100 Angstroms by 1.0 micrometers or smaller. Accidental discharge of electrostatic voltages of only a few volts through such a physically small resistor is sufficient to produce currents capable of severely damaging or completely destroying the MR sensor. The nature of the damage which may be experienced by an MR sensor varies significantly, including complete destruction of the sensor via melting and evaporation, contamination of the air bearing surface (the surface facing the surface of the magnetic disk), generation of shorts via electrical breakdown, and milder forms of damage in which the MR sensor performance may be degraded. Needless to say, the manufacturing yield is negatively affected. Because electrostatic charge may be introduced at any stage during assembly of the disk drive system, and that damaged sensor can only be practically tested and discovered towards the end of the manufacturing process, electrostatic induced damages result in significant waste in manufacturing resources. For those sensors which were degraded as a result of damage during processing but which passed initial acceptance tests by the manufacturer, the performance, reliability and service life of the assembled magnetic disk drive are put into question.

To combat against damage by electrostatic charges, it is desirable to provide a temporary means to electrically short the MR stripe. To accomplish this, several approaches were proposed in the past. U.S. Pat. No. 5,465,186 issued Nov. 7, 1995 which is commonly assigned to the assignee of the present invention, IBM Technical Disclosure Bulletin, Vol. 36, No. 12 published December 1993 and Vol. 38, No. 01 published on January 1995, disclosed various schemes, which included placing a shorting element (e.g. a diode or twisted conductor pair) across the MR sensor terminal pads on the MR head itself, or shorting the leads to the MR head at a point on the other end of the suspension arm away from the MR head. The shorts may be provided by conventional soldering, which are later physically cut towards the end of the head and suspension assembly processing.

While these earlier schemes were found to be satisfactory to reduce damage due to electrostatic discharge induced damages, they are not without limitation. As mentioned above, the sensitivity to electrostatic damage is particularly severe for thin film MR sensors because of the relatively small physical size of the sensor elements. With a push for higher recording densities, the physical size of sensor elements would be further reduced which makes the sensor elements even more susceptible to damage by electrostatic discharge or the presence of electrostatically charged field. That is, the smaller heads are prone to damage by yet smaller electrostatic discharges. Depending upon the point of injection of the static charge along the head suspension assembly, a small electrostatic charge could reach the head before it is dissipated by a shunt or dissipative device.

Further, the added parts and assembly steps involved in the current known techniques for electrostatic discharge protection increase processing complexity and cost, as well as add inertia to the MR head suspension assembly. The attachment of anything directly to the small MR head also takes up room on the head that is desirable for other purposes.

For the foregoing reasons, it becomes necessary to engineer a new method of protecting the MR heads from electrostatic induced damages.

SUMMARY OF THE INVENTION

The present invention provides an improved method of protecting against damage to an MR head caused by electrostatic discharge or the presence of electrostatically charged fields, by providing a shunt across the adjacent conductive leads or traces to the head at a point that is immediately adjacent their termination on the head.

Suspensions with the signal carrying conductors integrated into the suspensions allow for novel designs for producing such a shunt. These suspensions, hence forth referred to as integrated suspensions, are fabricated with conductors intimately attached to the suspensions. The characteristics of these conductors that are of importance to this invention are their approximately rectangular cross sectional profile, and the method of fabrication, commonly known in industry as photolithography (which is understood to include subtractive etching processes as well as additive processes).

According to one aspect of the present invention, the shunt is in the form of a solder bridge. The solder shunt is removed prior to putting the integrated suspension into operation in a magnetic disk drive system.

According to a further aspect of the present invention, the shunt is removed by reflowing the solder shunt and drawing the reflowed solder away from the leads to break electrical connection of the shunt across the adjacent leads to the MR sensor. To facilitate removing the shunt by reflowing the solder, at least one solder lobe of a chosen geometry is placed adjacent a lead. This lobe includes a confining lobe which serves to confine the solder in the shunt region when the shunt is formed, and a designated portion which serves to draw solder to a designated location away from the shunt region upon subsequent solder reflow thereby causing a physical break in the shunt. Physical removal of the solder material would not be required.

In another aspect of the present invention, the shunt is in the form of an integral piece of conductive material interconnecting the adjacent leads. This shunt may be removed using a laser to melt the material.

Various combinations of the foregoing are contemplated without departing from the spirit and scope of the present invention.

DESCRIPTION OF THE ILLUSTRATED EMBODIMENTS

The present description is for illustrative purpose and should not be taken in a limiting sense. The scope of the present invention can best be determined from the appended claims. For example, although the present invention is described in reference to a magnetic disk storage system, it will be apparent that the invention is also applicable to other magnetic storage systems including recording systems such as a magnetic tape recording system or other applications in which small components of a device require protection from electrostatic discharge.

Figure 1:
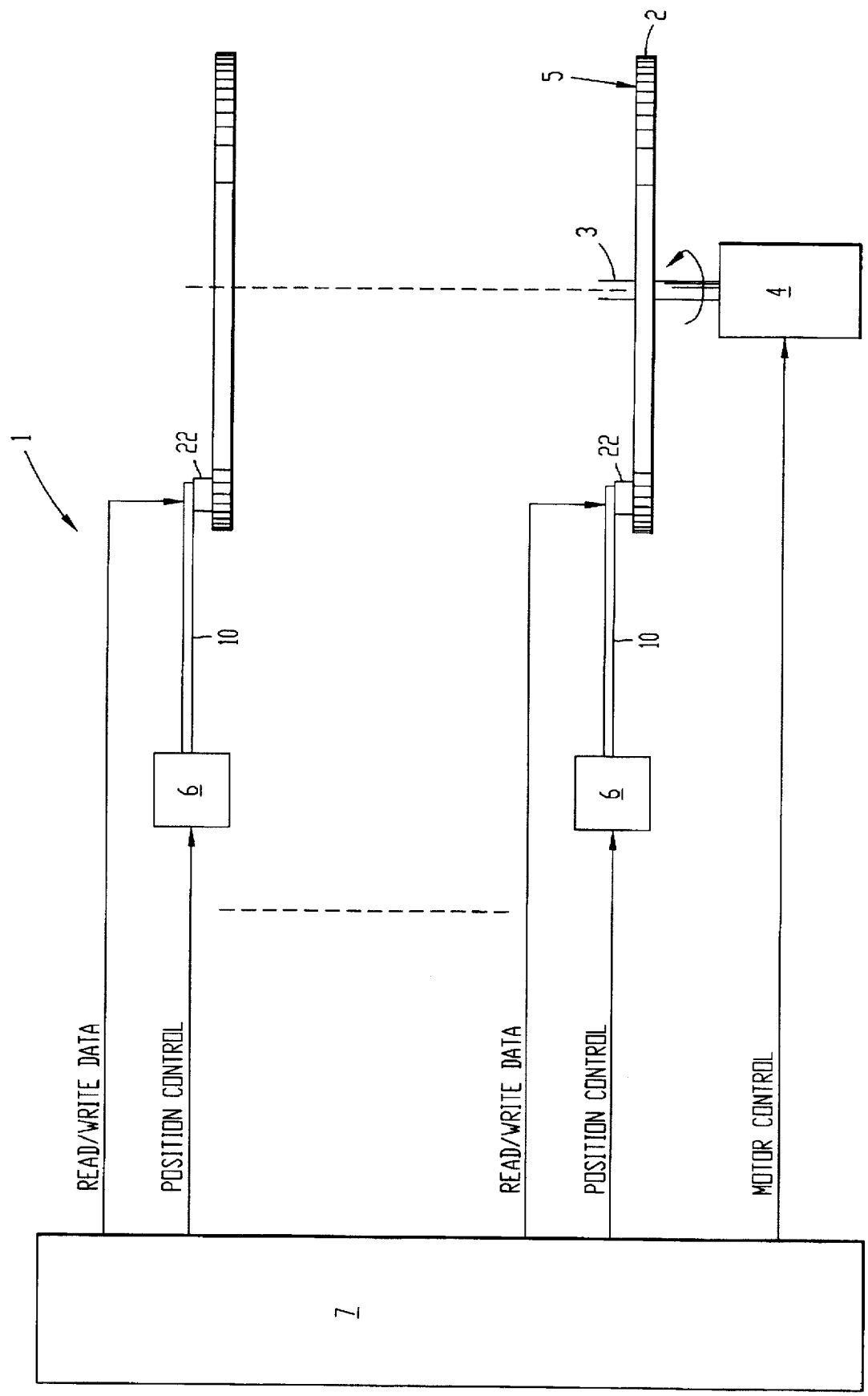
FIG. 1 is a simplified schematic block diagram of a magnetic disk storage system embodying the present invention.

FIG. 1 illustrates a simplified block diagram of a magnetic disk storage system 100 embodying the present invention. The magnetic disk storage system 100 comprises at least one rotatable magnetic disk 102 which is supported on a spindle 103 and rotated by a disk drive motor 104, and at least one MR head 22 positioned in close proximity to the magnetic recording media at the disk surface 105. Data is stored in the magnetic recording media on each disk 102 in the form of an annular pattern of concentric data tracks (not shown). Each MR head 22 contains one or more magnetic MR sensors and write transducers (not shown). The MR head 22 is mounted to an integrated suspension 10 which is attached to an actuator means 106. As the disk 102 rotates, the MR head 22 is moved across the disk surface 105 by the actuator head means so that the MR head 22 may access different portions of the disk surface 105 where desired data is recorded or read. The integrated suspension 10 provides a slight spring force which biases the MR head 22 against the disk surface 105 and controls flexibility in slight vertical as well as roll and pitch movements of the MR head 22 relative to the rotating disk surface 105. The actuator means as shown in FIG. 1 may be a voice coil motor (VCM), for example. The various components of the magnetic disk storage system are controlled in operation by control signals generated by control unit 107, such as control of the actuator means 106, drive motor 104 and reading/writing data.

Figure 2:
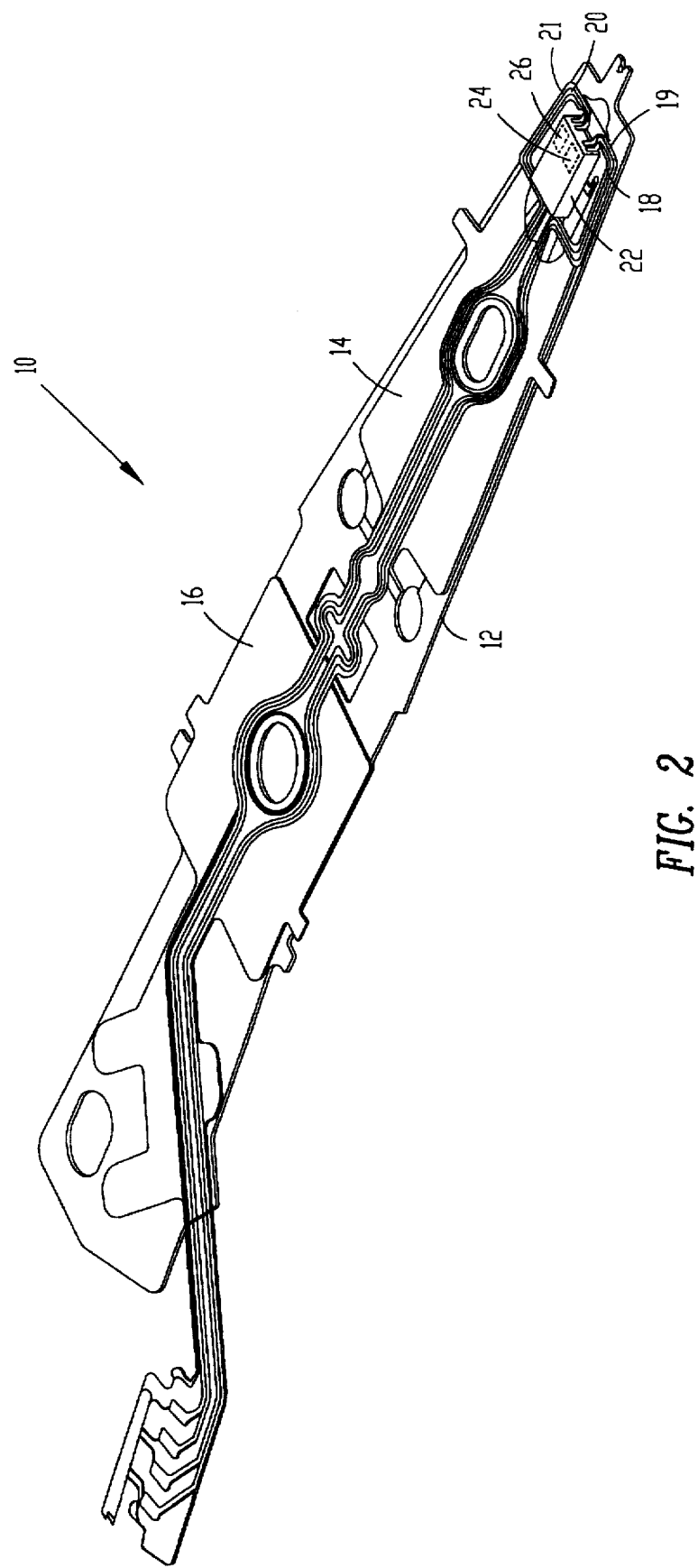
FIG. 2 is a perspective view of an integrated suspension supporting an MR head for use in the magnetic disk storage system, in which electrostatic protection is implemented in accordance with the method of the present invention.

Referring to FIG. 2, the perspective view of a 3-piece integrated suspension 10 is shown. This integrated suspension includes a load beam 12, a flexure 14 and a mount plate 16. The mount plate 16 pivotally supports the integrated suspension 10 about a spindle (not shown) of the actuator means 106 in the disk drive system 100. One end of the load beam 12 is fixedly attached to the mount plate 16, and the other end supports on its surface the flexure 14. In this particular integrated suspension 10 illustrated, the flexure 14 has integrated conductor leads 18, 19, 20, 21 or traces on its surface that is not facing the load beam 12. The leads 18, 19, 20, 21 are a thin film of conductive material which is separated from the structural layer of the flexure 14 by a layer of dielectric material. At the tip of the integrated suspension 10, an MR head 22 having integrated MR read sensor 24 and inductive write transducer 26 is supported on the flexure 14. (For simplicity, the read sensor 24 and write transducer 26 are schematically depicted by dotted lines in the figures.) The pair of leads 18, 19 terminate on head 22 in electrical contact with the MR read sensor 24, and the pair of leads 20, 21 are in electrical contact with the write transducer 26.

The afore-described basic construction of the integrated suspension 10 when taken alone does not form a part of the present invention, and is the subject matter of a separate invention of the common assignee herein. The integrated suspension 10 in FIG. 2 is referenced for purpose of illustrating the present invention. As will be appreciated from the disclosure below, the present invention is applicable to head suspension assemblies of other constructions.

According to the present invention, to protect the MR head 22 from electrostatic damage, an electrical shunt is placed across the adjacent MR sensor leads 18, 19 at a location immediately adjacent to and upstream of the lead terminations on the head 22. This ensures that electrostatic charge introduced along the integrated suspension 10 does not reach the MR head 22.

Figure 3A:
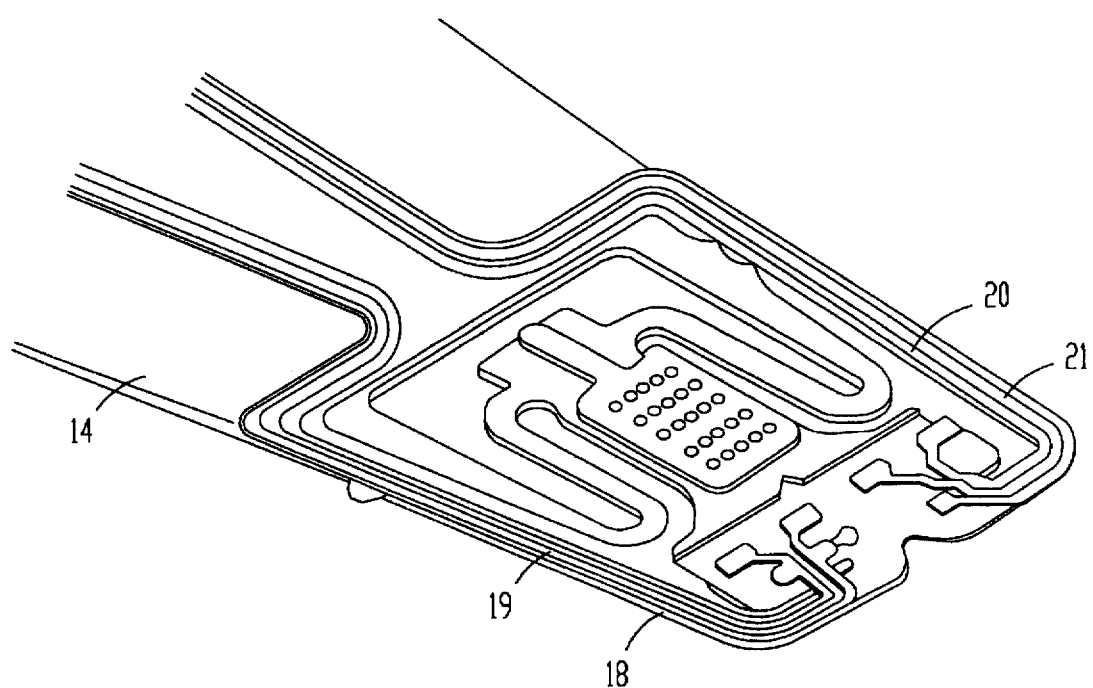
FIGS. 3(a)–(d) are partial perspective views of the integrated suspension illustrating the steps in which a solder shunt is implemented in accordance with one embodiment of the present invention.
Figure 3B:
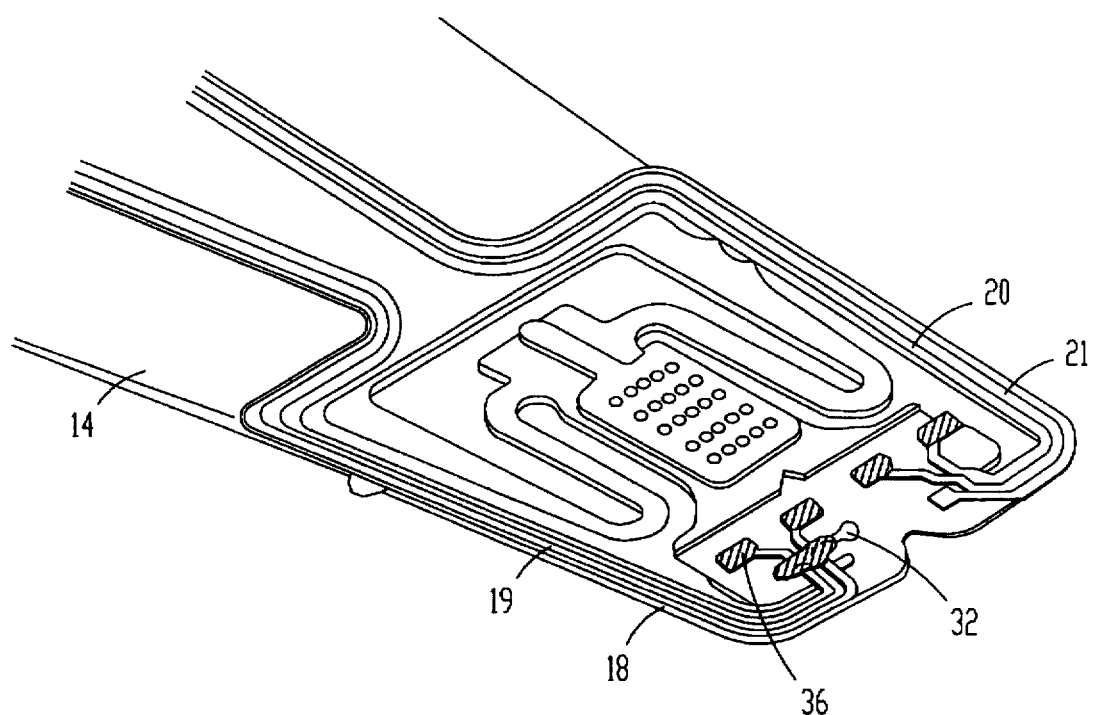
Figure 3C:
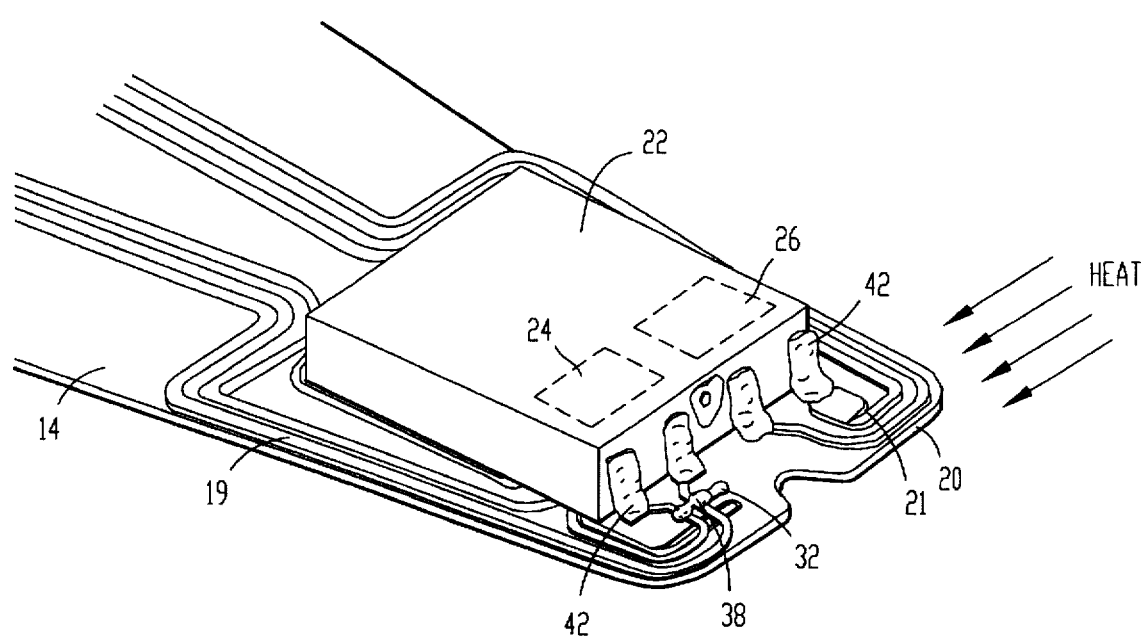
Figure 3D:
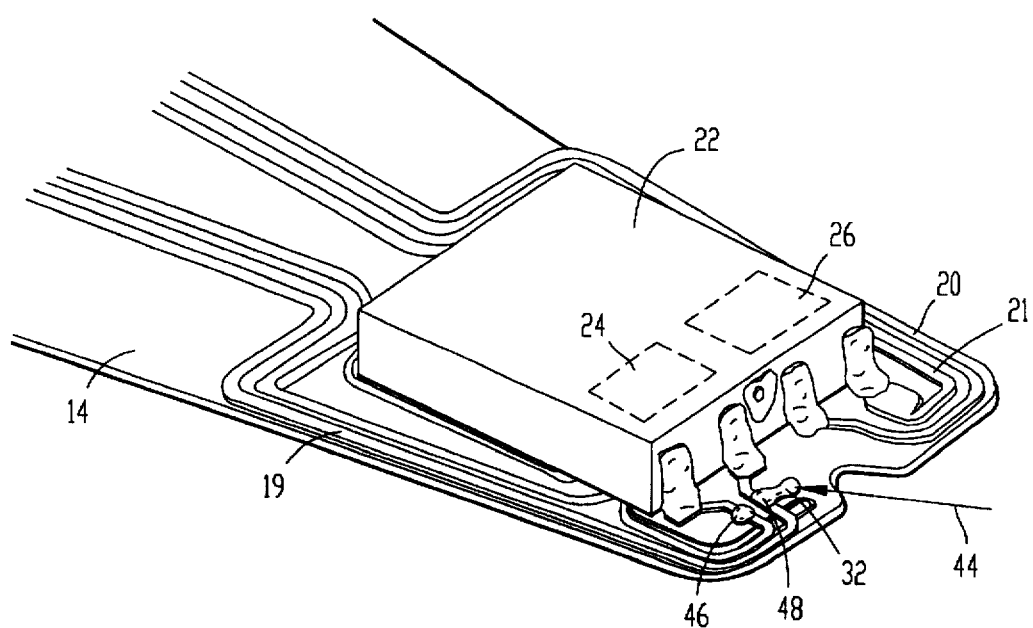
Figure 4A:
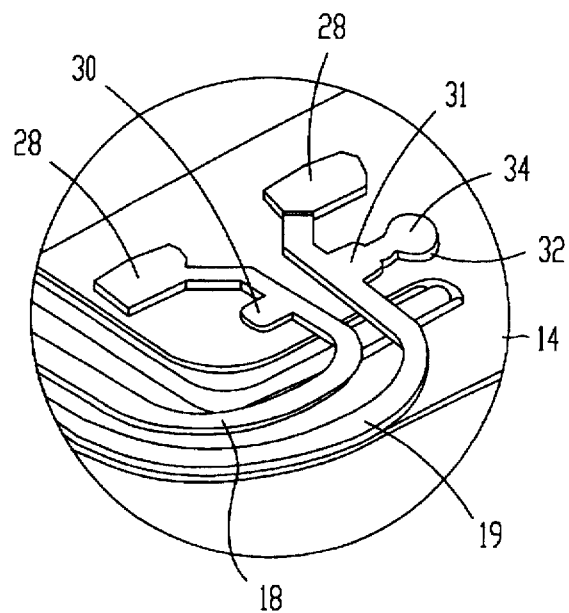
FIG. 4(a)–(d) are enlarged perspective views of the MR sensor region of the integrated suspension, corresponding to FIGS. 3(a)–(d).

Referring now to FIGS. 3(a)–(d) and FIGS. 4(a)–(d), detail steps of one embodiment of the method of the present invention are illustrated. In this embodiment, the MR head 22 is attached to the leads 18, 19, 20, 21 on the flexure 14 after a solder shunt has been put in place, for maximum protective effect. More particularly as shown in FIG. 3(a), the flexure 14 has been constructed with the leads 18, 19, 20, 21 integral thereon by any suitable process (e.g., using a conventional photolithographic process). Referring also to FIG. 4(a), termination pads 28 are provided at the end of these leads at which the MR head 22 is to be electrically connected thereto. Further, in accordance with the present invention, the leads 18, 19 to the MR sensor 24 are provided with two confining lobes 30, 31 adjacent the leads 18, 19 at the location where the solder shunt is to be placed (i.e., closely adjacent to and upstream of the termination pads). Lobe 31 has an appendage 32 joined thereto via a constricted section 34 of reduced width. As will be apparent in the discussion later, the appendage serves to define a designated location for collecting solder when opening the shunt by solder reflow. For manufacturing convenience, the pads 28, lobes 30, 31 and appendage 32 may be of the same material and formed simultaneously as the leads 18, 19, 20,. 21 are formed by a conventional photolithographic process, for example. These additional thin film structures do not add significant process steps to the formation of the flexure 14.

Figure 4B:
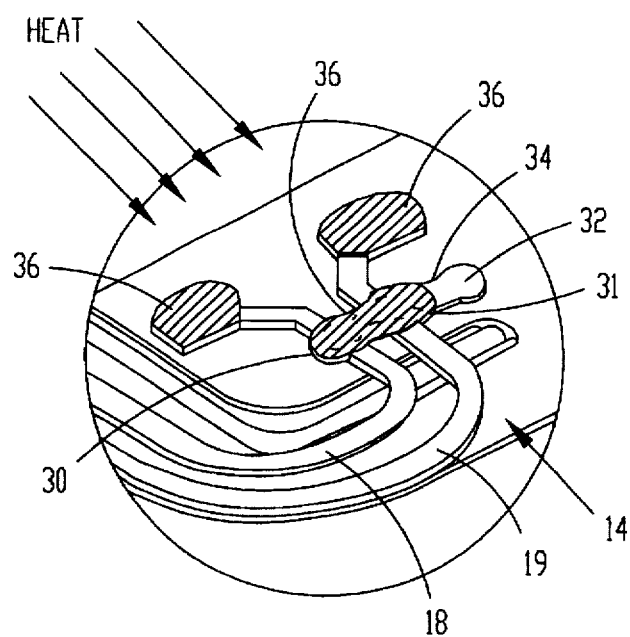

Referring to FIGS. 3(b) and 4(b), a solder paste 36 is then applied to cover the pads 28 and across the leads 18, 19 and lobes 30, 31 as shown by any conventional silk-screening process. Again, the solder paste 36 for the pads 28 and lobes 30, 31 may be conveniently deposited at the same time. Upon heating with a wide angle uniform heat source, such as an infrared tunnel furnace, the solder paste 36 is reflowed. Although screening of solder paste is the preferred method of solder application, any suitable method of applying free standing solder (solder that can be placed across a space) can be used, such as solder pre-forms, solder wire, or solder wire bumping.

Figure 4C:
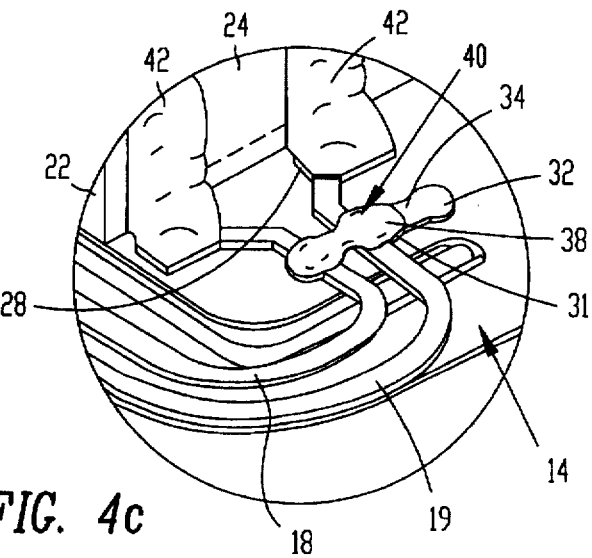

Referring to FIGS. 3(c) and 4(c), the molten solder 38 wets the entire surface of the pads 28 and the lobes 30, 31. The molten solder 38 is pulled equally to both lobes 30, 31 by surface tension, and maintains a bridge or shunt 40 between the two leads 18, 19. The tension in the molten solder 38 on the lobes 30, 31 and leads 18, 19 is symmetrical and is not sufficiently strong in any one lobe or lead to cause a break in the solder at the spacing between the leads 18, 19 as the spacing between these leads is very small. It is noted that the surface tension in the molten solder 38 and the ability to maintain the shunt 40 across the adjacent leads 18, 19 depend on a combination of factors including the lead spacing, the surface area wetted by the solder, and the amount and density of the solder material applied. Because the molten solder 38 tends to reach its minimum surface tension state, it will not flow down the leads 18, 19 due to such surface tension. It is noted that the reflowed solder 38 is restricted from flowing to the appendage 32 across the constricted section 34 from the lobe 31 (a confining portion), again because of surface tension tending to keep the molten solder 38 in a stable minimum tension state on the lobe 31 in the presence of the constricted section 34. The result is a single solder bump (shunt) 40 between the lobes 30, 31, as more clearly shown in FIG. 4(c) (a view after the MR head 22 has been attached and terminated in a separate process).

Figure 4D:
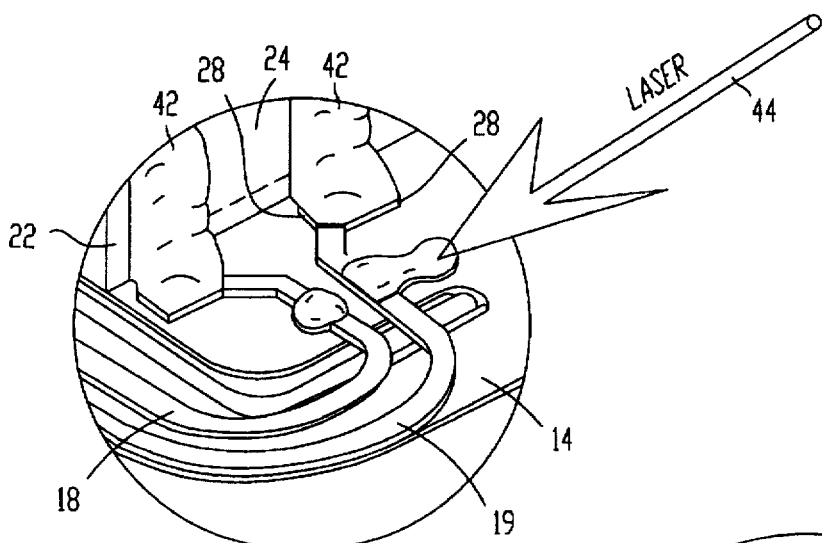

Referring to FIGS. 3(d) and 4(d), at a later processing step (e.g., at the end of the processing of the entire integrated suspension 10 or at any time prior to putting the MR head 22 into operation in a magnetic disk drive), the solder shunt 40 is separated when unequal heat is applied thereto. More specifically, the appendage 32 is selectively heated with a laser beam 44 to produce a thermal differential from the appendage 32 to the shunt 40. Heat is conducted into the shunt 40 from the side of the appendage 32. As the solder of the shunt 40 is reflowed, it tends to be drawn towards the appendage 32 via the constricted section 34 as the appendage 32 is at a higher temperature. However, the solder also tends to stay on the lobe 30, 31. As this happens, the shunt 40 is deprived of solder at the spacing between the leads 18, 19 and thus opening the shunt 40. The resultant structure is a solder bump 46 on the lobe 30 and a solder bump 48 on the lobe 31 and appendage 32 including the constricted section, with a clean break in the solder between the leads 18, 19, as more clearly shown in FIG. 4(d). The resultant solder bumps 48, 48 are left on the lobes 30, 31. If it is desired, these left over solder bumps 46, 48 may be removed from the lobes 30, 31, but it has not been found to be worthwhile to do so as the presence of these solder bumps do not significantly affect the performance of the integrated suspension 10.

The actual geometry and configuration of the lobes 30, 31 and appendage 32 may vary without departing from the spirit and scope of the present invention. While the present invention is not dependent upon a particular geometry and configuration, it has been found that the above embodiment may be implemented with lobe 31 and appendage 32 generally in an "H" or "8" configuration, with a constriction between the appendage and the lobe. The size and shape of the lobes 30, 31 and appendage 32 may also be varied. The exact configuration and dimensions of the lobes 30, 31 and appendage 32 are not critical and may be varied to the extent that they, coupled with the size and spacing between the leads 18, 19 and the amount of solder paste 36 used (see below), function to maintain molten solder to form the bridge/shunt 40 upon initial reflow of the solder paste 36 and to conduct subsequent reflowed solder 48 to the appendage 32 upon application of a thermal gradient to the appendage/ lobe structure.

To facilitate solder wetting on the pads 28 and lobes 30, 31, it may be desirable to prepare their surfaces by conventional processes, such as cleaning, fluxing, gold plating and/or tinning. The amount of solder paste to be applied to the lobes 30, 31 would depend on the size and shape of these lobes, the type of solder paste and the spacing between the leads adjacent there. Needless to say, it would be desirable to use the least amount of solder possible to reduce the weight of the flexure/head structure for obvious reasons. The particular laser 44 to be used for reflow and the reflow temperature would depend on the particular solder used. It is noted that the steps for forming the shunt 40 may be separate from the steps for bonding the leads 18, 19, 20, 21 to the MR head 22. Further, the MR head 22 may be bonded to the lead terminations by means other than soldering, such as by known ultrasonic bonding processes.

For illustrative purpose, the parameters for an example in which the above described embodiment may be implemented effectively is set forth below. Given a lead dimension of 50 microns in width with a centerline spacing of 125 microns, the following parameters of the lobe and appendage structures have been found to be effective:

(a) lobes 30, 31: shape and size =100×100 microns with full radiused end;

(b) appendage 32: shape and size =75 microns diameter circle;

(c) constricted section: shape and size =75 micron length, 50 micron width;

(d) volume of solder paste =3.0×E-3 to 4.4×E-3 cubic millimeter;

(e) type of solder paste =Eutectic Sn—Pb, Bi—Sn or other suitable solder;

(f) reflow temperature for solder paste =160 degree C. using an infrared tunnel furnace for eutectic Bi—Sn;

(g) laser for shunt reflow =a fine focused beam of Nd Yag laser aimed at appendage 32 with approximate energy of 100 to 500 millijoules (the energy to open the shunt will vary with the amount and type of solder used) for a duration of 0.5 to 2 seconds.

(The foregoing values are intended to provide an order of magnitude of the relative dimensions and parameters. Variations of these values can be made without departing from the implementation of the present invention.)

Figure 5A:
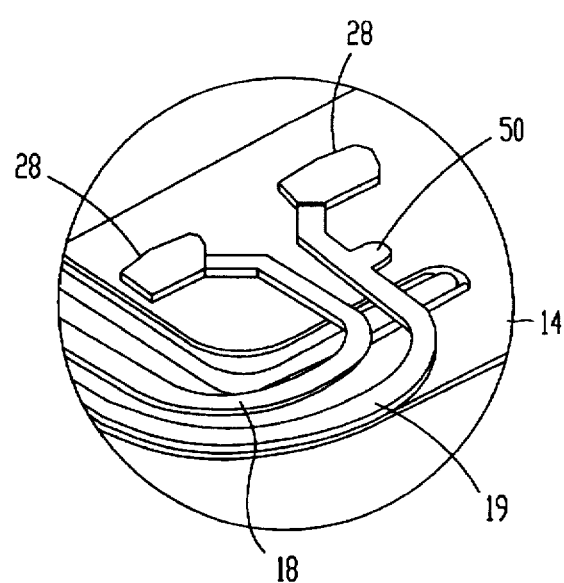
FIG. 5(a)–(d) are enlarged perspective views of the MR sensor region of the integrated suspension, illustrating the steps in which a solder shunt is implemented in accordance with another embodiment of the present invention.
Figure 5B:
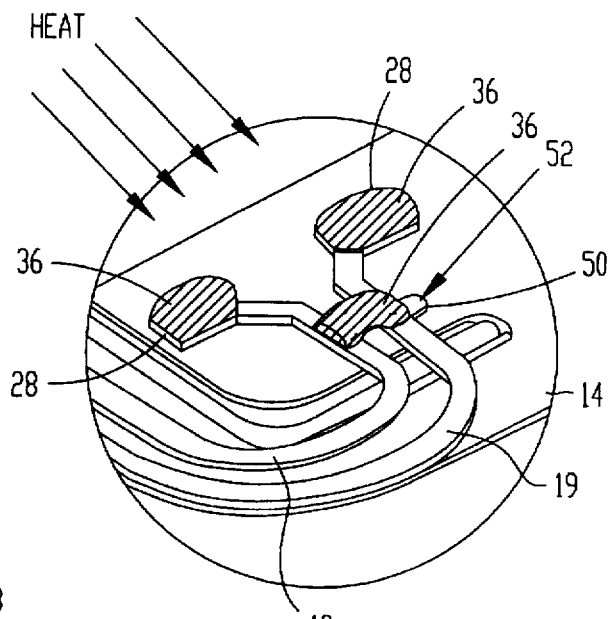
Figure 5C:
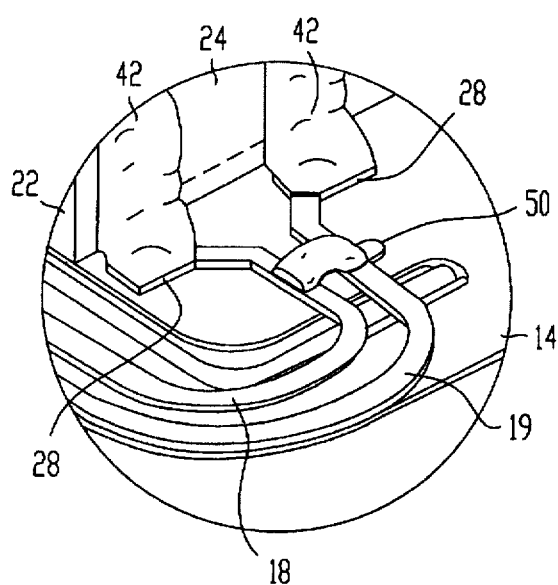

Referring now to FIGS. 5(a)–(d), a second embodiment of the method of the present invention is disclosed. For convenience, only the enlarged views of the MR sensor lead termination region are illustrated, corresponding to FIGS. 4(a)–(d). The other parts of the integrated suspension 10 including the MR head remains unchanged from the earlier embodiment. In this embodiment, the formation of the shunt is done in the presence of a single lobe 50 adjacent one of the leads 19 to the MR sensor 24. Solder paste 36 is screened onto the leads 18, 19 adjacent to the lobe 50 (crosshatched regions in FIG. 5(b)). To confine the solder from flowing over the entire lobe 50 and down the leads 18 and 19 upon subsequent reflow of the solder paste 36 to form a shunt, a solder barrier 52 (dotted regions in FIG. 5(b)) such as a removable solder mask is pre-applied over the leads 18 and 19 outside of the shunt region and on the lobe 50 by conventional masking or screening process before screening on the solder paste 36. In this embodiment, the designated portion may be the entire lobe 50 (as shown) or part thereof (not shown). The confining portion would be the part of the lobe 50 on which solder paste did not cover. It is noted that since the lobe 50 is integrally formed with the lead 19, one may say that there would be a confining portion (albeit small portion) on the lobe 50 regardless of the coverage of the solder barrier on the lobe 50. After reflow, the solder barrier 52 is removed by conventional process to expose the lobe 50. FIG. 5(c) shows the state at which the solder paste 36 has been reflowed to form the solder shunt 54 with this barrier 52 removed. As in the earlier embodiment, the MR head 22 has been attached to the flexure 14 by a separate process.

Figure 5D:
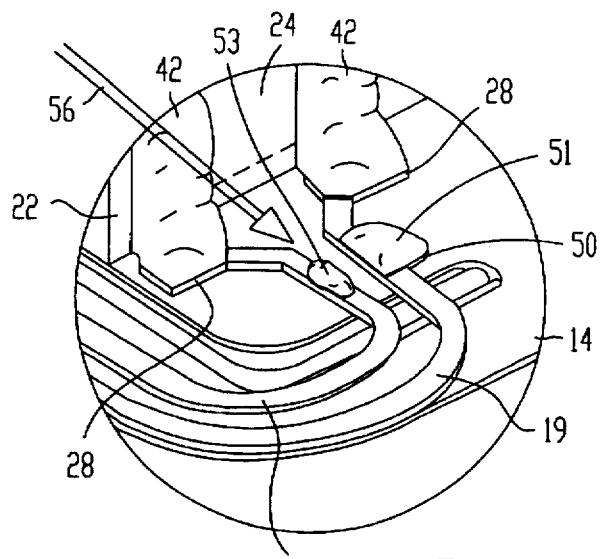

Referring to FIG. 5(d), when it is time to open the shunt 54, heat is directed at the shunt 54 using a laser 56, for example. As the solder of the shunt 54 is reflowed, surface tension due to wetting of the exposed lobe 50 pulls the solder onto the entire surface of the lobe 50. Solder is depleted in the spacing between the adjacent leads 18,19 as a solder bump 51 forms on lobe 50 with a smaller solder bump 53 remaining on the lead 18. As a result, the shunt 54 is opened.

Like the earlier embodiment, the actual geometry and configuration of the lobe 50 may vary without departing from the spirit and scope of the present invention. The size and shape of the lobe 50 may also be varied. The exact configuration and dimensions of the lobe 50 are not critical and may be varied to the extent that they, coupled with the spacing between the leads and the amount of solder paste 36 used, function to maintain molten solder to form the bridge/shunt 54 upon initial reflow of the solder paste 36 and to conduct subsequent reflowed solder to wet the entire lobe 54 upon application of heat to the shunt structure.

For illustrative purpose, the parameters for an example in which the present embodiment may be implemented effectively is set forth below. Given a lead dimension of 50 microns in width with a centerline spacing of 125 microns, the following parameters of the lobe structure have been found to be effective:

(a) lobe 54: shape and size =100×100 microns with full radiused end;

(b) amount of solder paste =1.3×E-3 to 2×E-3 cubic millimeters;

(c) type of solder paste =Eutectic Sn—Pb, Bi—Sn or any other suitable solder;

(d) fellow temperature for solder paste =160 degree C. using an infrared tunnel furnace for eutectic Bi—Sn;

(e) laser for shunt reflow =a focused beam of Nd Yag laser aimed at the shunt with approximate energy of 100 to 500 millijoules (the energy required to open the shunt will vary with the amount and type of solder used) for a duration of 0.5 to 2 seconds.

(The foregoing values are intended to provide an order of magnitude of the relative dimensions and parameters. Variations of these values can be made without departing from the implementation of the present invention.)

Figure 6:
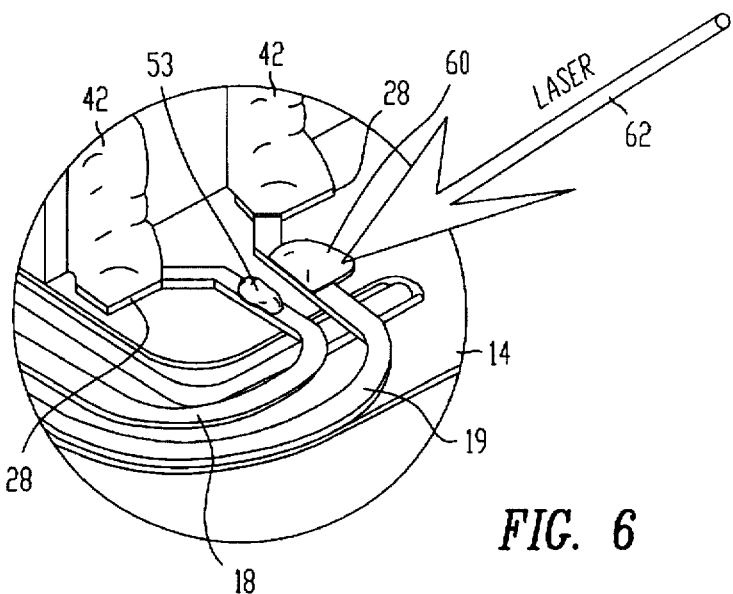
FIG. 6 is an enlarged perspective view of the MR sensor region of the integrated suspension, illustrating an alternate step to the step of FIG. 5(d).

It is also possible, but not necessary, to use a differential heating approach to reflow the solder shunt 54 as in the earlier embodiment in reference to FIGS. 3 and 4. Instead of uniformly heating the shunt 54 as in FIG. 5(d), a laser beam 58 is directed at the exposed part of the lobe 50 to create a thermal gradient in the solder shunt 54 and lobe 50 (see FIG. 6). As explained earlier in connection with the embodiment in FIGS. 3 and 4, this has the effect of drawing the reflowed solder towards the exposed lobe 50, which results in a break in the shunt 54.

It is further contemplated that a lobe may be positioned adjacent the lead 18 (not shown in the figures) to further facilitate the opening of the shunt by adding surface area onto which the molten solder can flow. Various combinations of the steps of providing lobe(s) and solder barrier are conceivable and may be implemented within the aspect of the present invention directed to applying a shunt and subsequent removal thereof without using intrusive means such as a cutter.

Figure 7A:
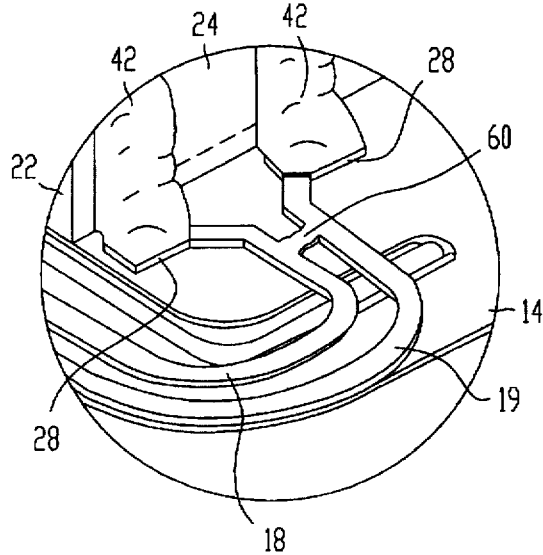
FIG. 7(a)–(b) are enlarged perspective views of the sensor region of the integrated suspension, illustrating the steps in which a conductive shunt is implemented in accordance with another embodiment of the present invention.
Figure 7B:
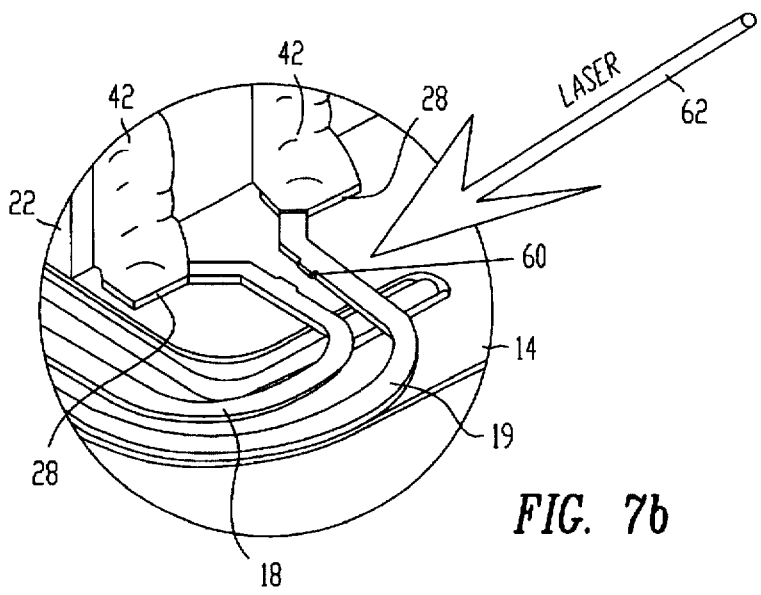

In another aspect of the present invention as illustrated in FIGS. 7(a) and (b), instead of a solder shunt as presented in the earlier embodiments, an integral bridge 60 of conductive material may be provided which interconnects the adjacent leads 18, 19 (FIG. 7(a)). The leads 18, 19 along with the interconnecting bridge 60 may be formed at the same time by a photolithographic process, for example. A laser 62 is used to break the bridge 60 at a desire stage of integrated suspension processing (FIG. 7(b)). The conductive material of the bridge 60 melts back from the laser beam, thus opening the bridge shunt. This method works best if the material for the interconnecting bridge 60 and leads 18, 19 is relatively thin (less that 5000 Angstrom thick), in order to minimize the amount of heat required to melt or cut the material at the shunt.

While the present invention has been particularly shown and described with reference to the illustrated embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims. Although this invention describes shunts adjacent to the MR head leads, it is obvious that these shunts may be located at any location on the integrated suspension and still maintain the spirit of this invention.

We claim:

1. A method for protecting an MR sensor in an MR head mounted on a head suspension assembly from damage caused by electrostatic charge during handling and assembly of said magnetic head in a magnetic storage system, said MR sensor electrically connected to spaced apart first and second leads having lead terminations on said MR head, said method comprising the steps of:

providing a shunt across said leads at a location along said leads on said head suspension assembly adjacent to said leads terminations on said MR head, said shunt comprising a bridge portion and a lobe portion, said lobe portion provided for opening of said bridge portion; and opening said shunt at a desired process or assembly of said magnetic head in a magnetic storage system.

2. A method as claimed in claim 1 wherein the first and second leads are spaced apart with a lead spacing between said leads, and the step of providing said shunt includes the step of forming a solder bridge across said leads over said lead spacing.

3. A method as claimed in claim 2 wherein the step of opening said shunt includes the step of reflowing said solder bridge and drawing the solder away from said lead spacing.

4. A method as claimed in claim 1 wherein the step of providing the shunt includes the step of forming a bridge section integrally interconnecting the first and second leads.

5. A method as claimed in claim 4 wherein the step of opening the shunt includes the step of melting the bridge section.

6. A method as claimed in claim 5 wherein melting is effected by using a laser.

7. A method for protecting an MR sensor in an MR head mounted on a head suspension assembly from damage caused by electrostatic charge during handling and assembly of said magnetic head in a magnetic storage system, said MR sensor electrically connected to first and second leads spaced apart with a lead spacing between said leads and having lead terminations on said MR head, said method comprising the steps of:

forming a solder bridge across said leads over said lead spacing at a location along said leads and adjacent to said lead terminations on said MR head; and opening said shunt by reflowing said solder bridge and drawing the solder away from said lead spacing at a desired process or assembly step prior to the completion of said handling and assembly of said magnetic head in a magnetic storage system;

wherein the step of forming said solder bridge includes the step of providing a lobe alongside said first lead and adjacent said MR head, said lobe having a confining portion and a designated portion, and wherein the solder covers the confining portion of said lobe when first applied to form the solder bridge and the solder covers also the designated portion beyond said confining portion when the solder bridge is reflowed thereby drawing the solder away from said lead spacing.

8. A method as claimed in claim 7 wherein the step of reflowing the solder bridge includes the step of directing heat at said designated portion of the lobe to form a thermal gradient along the designated portion to said confining portion and reflowing the solder in said solder bridge, the thermal gradient causing the solder from the reflowed solder bridge to flow to the designated portion, thereby depleting solder at said lead spacing to open the shunt.

9. A method as claimed in claim 8 wherein said confining portion of the lobe is defined by a primary lobe and said designated portion is defined by an appendage lobe, said appendage lobe including a constricted section of reduced width connecting said primary lobe to said appendage lobe, and wherein when solder is first applied to the primary lobe to form the solder bridge said solder is confined to said primary lobe by action of surface tension of the solder in relation to the constricted section.

10. A method as claimed in claim 9 wherein the amount of solder to be applied and the shapes and dimensions of said primary lobe, appendage lobe and constricted section are chosen such that the solder remains on the primary lobe without flowing to the appendage lobe through the constricted section when the solder is first applied to form the solder bridge, and thereafter in the presence of said thermal gradient the solder depletes at the lead spacing upon reflow of the solder bridge when reflowed solder flows to the appendage lobe via the constricted section.

11. A method as claimed in claim 8 wherein the heat is provided by a laser.

12. A method as claimed in claim 8 wherein the step of forming the solder bridge further includes the steps of covering the lobe with a solder barrier to define the designated portion before the solder bridge is in place, and removing the solder barrier to expose the designated portion thereafter but prior to reflowing the solder bridge.

13. A method as claimed in claim 7 wherein the step of forming the solder bridge further includes the step of applying free standing solder across the lead spacing and on the confining portion of the lobe and reflowing the free standing solder to form the solder bridge.

14. A method as claimed in claim 7 wherein the step of forming a solder bridge further includes the step of providing a lobe alongside said second lead and adjacent said MR head.

15. A method as claimed in claim 14 wherein the shape and dimensions of said lobe alongside said second lead are chosen such that the solder remains on said lobe alongside said second lead as solder is drawn from the lead spacing to the confining portion upon reflow of the solder bridge.

16. A method as claimed in claim 7 wherein the step of reflowing the solder bridge includes the step of directing heat at the solder bridge to reflow the solder in said solder bridge, the solder from the reflowed solder bridge flowing to the designated portion thereby depleting solder at said lead spacing to open the shunt.

17. A method as claimed in claim 16 wherein the step of forming the solder bridge further includes the steps of providing a barrier means to define the designated portion before the solder bridge is in place, and removing the barrier means to expose the designated portion thereafter but prior to reflowing the solder bridge.

18. A method for protecting an MR sensor element in an MR head mounted on a head suspension assembly from damage caused by electrostatic charge during handling and assembly of said magnetic head in a magnetic storage system, said MR sensor electrically connected to spaced apart first and second leads having lead terminations on said MR head, said method comprising the steps of:

providing a solder lobe alongside said first lead and adjacent to said lead terminations on said MR head, said lobe having a confining portion and a designated portion;

applying free standing solder to the confining portion and across the first and second leads;

reflowing the free standing solder to form a solder bridge across the first and second leads, said solder bridge having one end on the confining portion; and at a desired process or assembly step prior to the completion of said handling and assembly of said magnetic head in a magnetic storage system, directing heat at the designated portion to create a thermal gradient between the designated portion and the confining portion and to reflow the solder bridge, the solder of the solder bridge flowing to the designated portion thereby depleting the solder between the first and second leads to break the solder bridge.

19. A method as claimed in claim 18 wherein the solder lobe is generally shaped with a constricted section of reduced width between first and second lobe sections, the first lobe section being the confining portion immediately adjacent the first lead and the second lobe section being the designated portion.

20. A magnetic storage system comprising:

a magnetic storage medium having a plurality of tracks for receiving data;

an MR head including an MR sensor maintained in a closely spaced position relative to said magnetic storage medium during relative motion between said MR head and said storage medium;

actuator means coupled to said MR head for moving said MR head relative to the magnetic storage medium to selected tracks on said magnetic storage medium, said actuator means including a head suspension assembly on which the MR head is mounted;

said head suspension assembly including first and second leads thereon which are electrically connected to the MR sensor and which are arranged in a spaced apart relationship and have lead terminations on the MR head; and conductive means interconnecting the first and second leads at a location along said first and second leads and adjacent said lead terminations for providing a conductive path bypassing the MR sensor during discharge of electrostatic charge; and detecting means coupled to said MR sensor for detecting resistance changes in said MR sensor responsive to magnetic fields representative of data bits recorded in said magnetic storage medium intercepted by said MR sensor:

wherein the conductive means is a solder bridge, and said head suspension assembly further includes a solder lobe at a location alongside the first lead and adjacent to the lead terminations, said solder lobe having a confining portion for application of solder to form a solder bridge across the leads and a designated portion for collecting solder upon reflow of the solder bridge, and wherein the solder bridge has a first end on the confining portion and a second end on the second lead.

21. A magnetic storage system as claimed in claim 20, wherein the solder lobe is generally shaped with a constricted section of reduced width between first and second lobe sections, the first lobe section being the confining portion immediately adjacent the first lead and the second lobe section being the designated portion, and wherein the solder bridge has its first end on the first lobe section.

22. An integrated suspension assembly for supporting an MR head in a magnetic storage system comprising:

flexible means for supporting an MR head having a MR sensor;

first and second leads on the flexible means which are electrically connected to the MR sensor and which are arranged in a spaced apart relationship and have lead terminations on the MR head; and conductive means interconnecting the first and second leads at a location along said first and second leads and adjacent said lead terminations for providing a conductive path bypassing the MR sensor during discharge of electrostatic charge;

wherein the conductive means is a solder bridge, and said head suspension assembly further includes a solder lobe at a location alongside the first lead and adjacent to the lead terminations, said solder lobe having a confining portion for application of solder to form a solder bridge across the leads and a designated portion for collecting solder upon reflow of the solder bridge, and wherein the solder bridge has a first end on the confining portion and a second end on the second lead.

23. An integrated suspension assembly as claimed in claim 22, wherein the solder lobe is generally shaped with a constricted section of reduced width between first and second lobe sections, the first lobe section being the confining portion immediately adjacent the first lead and the second lobe section being the designated portion, and wherein the solder bridge has its first end on the first lobe section.

24. A magnetic storage system comprising:

a magnetic storage medium having a plurality of tracks for receiving data;

an MR head including an MR sensor maintained in a closely spaced position relative to said magnetic storage medium during relative motion between said MR head and said storage medium;

actuator means coupled to said MR head for moving said MR head relative to the magnetic storage medium to selected tracks on said magnetic storage medium, said actuator means including a head suspension assembly on which the MR head is mounted;

said head suspension assembly including first and second leads thereon which are electrically connected to the MR sensor and which are arranged in a spaced apart relationship and have lead terminations on the MR head, and a solder lobe at a location alongside the first lead and adjacent to the lead terminations, said solder lobe having a confining portion for application of solder to form a solder bridge across the first and second leads, thereby to provide a conductive path bypassing the MR sensor during discharge of electrostatic charge and a designated portion for collecting solder upon reflow of such solder bridge; and detecting means coupled to said MR sensor for detecting resistance changes in said MR sensor responsive to magnetic fields representative of data bits recorded in said magnetic storage medium intercepted by said MR sensor.

25. A magnetic storage system as claimed in claim 24, wherein the solder lobe is generally shaped with a constricted section of reduced width between first and second lobe sections, the first lobe section being the confining portion immediately adjacent the first lead and the second lobe section being the designated portion, and wherein the solder bridge when formed has one of its ends on the first lobe section.

26. An integrated suspension assembly for supporting an MR head in a magnetic storage system, comprising:

flexible means for supporting an MR having an MR sensor;

first and second leads on the flexible means which are electrically connected to the MR sensor and which are arranged in a spaced apart relationship and have lead terminations on the MR head; and a solder lobe at a location alongside the first lead and adjacent to the lead terminations, said solder lobe having a confining portion for application of solder to form a solder bridge across the leads, thereby to provide a conductive path bypassing the MR sensor during discharge of electrostatic charge and a designated portion for collecting solder upon reflow of such solder bridge.

27. An integrated suspension assembly as claimed in claim 26 wherein the solder lobe is generally shaped with a constricted section of reduced width between first and second lobe sections, the first section being the confining portion immediately adjacent the first lead and the second lobe section being the designated portion, and wherein the solder bridge when formed has one of its ends on the confining portion.

* * * * *